(12) United States Patent
Krautbauer et al.

(10) Patent No.: US 8,449,675 B2
(45) Date of Patent: May 28, 2013

(54) SEMICONDUCTOR WAFER WITH AN EPITAXIALLY DEPOSITED LAYER, AND PROCESS FOR PRODUCING THE SEMICONDUCTOR WAFER

(75) Inventors: Rupert Krautbauer, Portland, OR (US); Gerhard Huettl, Engelsberg (DE); Andrej Lenz, Tittmoning (DE); Erwin-Peter Mayer, Burghausen (DE); Rainer Winkler, Zorneding (DE)

(73) Assignee: Siltronic AG, Munich (DE)

( * ) Notice: Subject to any disclaimer, the term of this patent is extended or adjusted under 35 U.S.C. 154(b) by 1338 days.

(21) Appl. No.: 12/180,739

(22) Filed: Jul. 28, 2008

(65) Prior Publication Data
US 2008/0286951 A1    Nov. 20, 2008

Related U.S. Application Data

(62) Division of application No. 11/298,012, filed on Dec. 9, 2005, now abandoned.

(30) Foreign Application Priority Data

Dec. 16, 2004  (DE) .......................... 10 2004 060 624

(51) Int. Cl.
*C30B 21/02*  (2006.01)

(52) U.S. Cl.
USPC ............... 117/90; 117/89; 117/101; 117/102; 117/104

(58) Field of Classification Search
USPC .................. 117/86, 89, 90, 101, 102, 104
See application file for complete search history.

(56) References Cited

U.S. PATENT DOCUMENTS

2001/0031538 A1  10/2001  Dekker et al.
2005/0242859 A1  11/2005  Meltzer et al.

FOREIGN PATENT DOCUMENTS

| EP | 0 578 996 A1 | | 1/1994 |
|---|---|---|---|
| GB | 2156148 | * | 10/1985 |
| GB | 2156148 A | | 10/1985 |
| JP | 60154661 A | | 8/1985 |
| JP | 06-084819 | | 3/1994 |
| JP | 09232324 | * | 5/1997 |
| JP | 09232324 A | | 9/1997 |
| JP | 10-050714 | | 2/1998 |
| JP | 2002203772 | | 7/2002 |
| JP | 2003-526204 | | 9/2003 |

OTHER PUBLICATIONS

Patent Abstract of Japan, Pub. No. JP 2002203772 A, Pub. Date. Jul. 19, 2002; Applicant: Nec Corp., Title: "Method for Manufacturing Mask for Electron Beam Exposure and Method for Forming Thin Film".
Patent Abstract of Japan, Pub. No. JP 09232324 A, Pub. Date: Sep. 5, 1997; Applicant: Nec Corp., Title: "Semiconductor Substrate and Its Manufacture".
U.S. 2001031538 is the Equivalent to JP 2003-526204.
Patent Abstract of Japan corresponding to JP 10-050714.

* cited by examiner

*Primary Examiner* — Bob M Kunemund
(74) *Attorney, Agent, or Firm* — Brooks Kushman P.C.

(57) ABSTRACT

A semiconductor wafer is formed of a substrate wafer of single crystal silicon doped with dopant atoms of the n type or p type, with a front surface and a back surface, contains a layer deposited epitaxially on the front surface of the substrate wafer. The substrate wafer additionally includes an $n^{++}$ or $p^{++}$ doped layer, which extends from the front surface of the substrate wafer into the substrate wafer and has a defined thickness. The semiconductor wafer is produced by a process in which dopant atoms of the n type or p type are introduced into the substrate wafer through the front surface of the substrate wafer, the dopant concentration in a layer which extends from the front surface of the substrate wafer into the substrate wafer being increased from the level $n^+$ or $p^+$ to the level $n^{++}$ or $p^{++}$, and an epitaxial layer is then deposited on this layer.

17 Claims, 2 Drawing Sheets

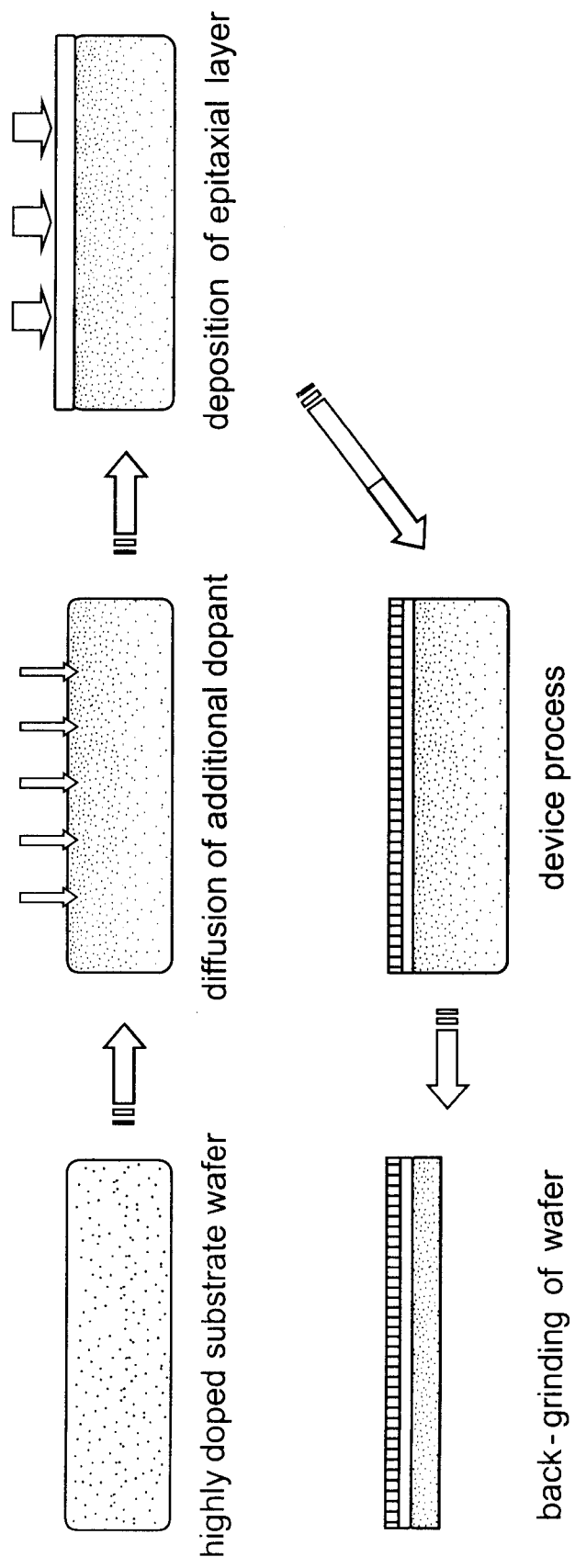

SEMICONDUCTOR WAFER WITH AN EPITAXIALLY DEPOSITED LAYER, AND PROCESS FOR PRODUCING THE SEMICONDUCTOR WAFER

This is a divisional application of copending U.S. application Ser. No. 11/298,012 filed Dec. 9, 2005, and also claims priority to that application and to German Application DE 10 2004 060 624.2 filed Dec. 16, 2004.

BACKGROUND OF THE INVENTION

1. Field of the Invention

The invention relates to a semiconductor wafer comprising a silicon substrate wafer doped with dopant atoms of the n type or p type and having a low resistance, with a front surface and a back surface, and comprising a layer deposited epitaxially on the front surface of the substrate wafer.

2. Background Art

A semiconductor wafer of the type to which the invention is directed is suitable, in particular, as a base material for the fabrication of electronic power semiconductor components, with the components being integrated in the epitaxially deposited layer (epi layer) and the flow of current through such components usually passing through the epi layer and the substrate beneath it. The electrical resistance of power semiconductor components, in the on state, is therefore dependent to a significant extent on the resistivity of the substrate wafer, and this resistivity is approximately inversely proportional to the concentration of the dopant atoms. When producing the single crystal which is subsequently divided into substrate wafers, the concentration of these dopant atoms is usually set by the addition of dopant.

The processes for producing single crystals from silicon which are in most widespread use on an industrial scale are the Czochralski method (CZ method) and the float zone method (FZ method). However, it is not possible to increase the concentration of dopant atoms without restriction in such processes. If the dopant concentrations in the melt are too high, dislocations which disrupt the single crystal structure of the crystal are formed during the pulling of single crystals using the CZ method. The lowest substrate resistance which can be achieved by adding dopant when producing the single crystal also depends on the type of dopant and the size of the single crystal. In the case of phosphorus, the lowest resistance produced in this way is in the region of 0.71 mOhmcm. For crystals with a diameter of 150 mm or 200 mm, as are used for the industrial manufacture of the latest generation of power semiconductor components, the lowest resistance which can be achieved in practice is, however, above this value (approx. 0.9 mOhmcm).

SUMMARY OF THE INVENTION

It is an object of the present invention to provide a semiconductor wafer having an epitaxial layer, which comprises a substrate wafer of single crystal silicon doped with dopant atoms of the n type or p type, the resistivity of which is particularly low. This and other objects are provided by an n type or p type wafer which has an $n^{++}$ or $p^{++}$ layer extending into the wafer and positioned below an epitaxial layer.

BRIEF DESCRIPTION OF THE DRAWINGS

FIG. 2 illustrates one type of semiconductor processing employing the wafers of the invention.

DETAILED DESCRIPTION OF THE PREFERRED EMBODIMENT(S)

Figure 1:
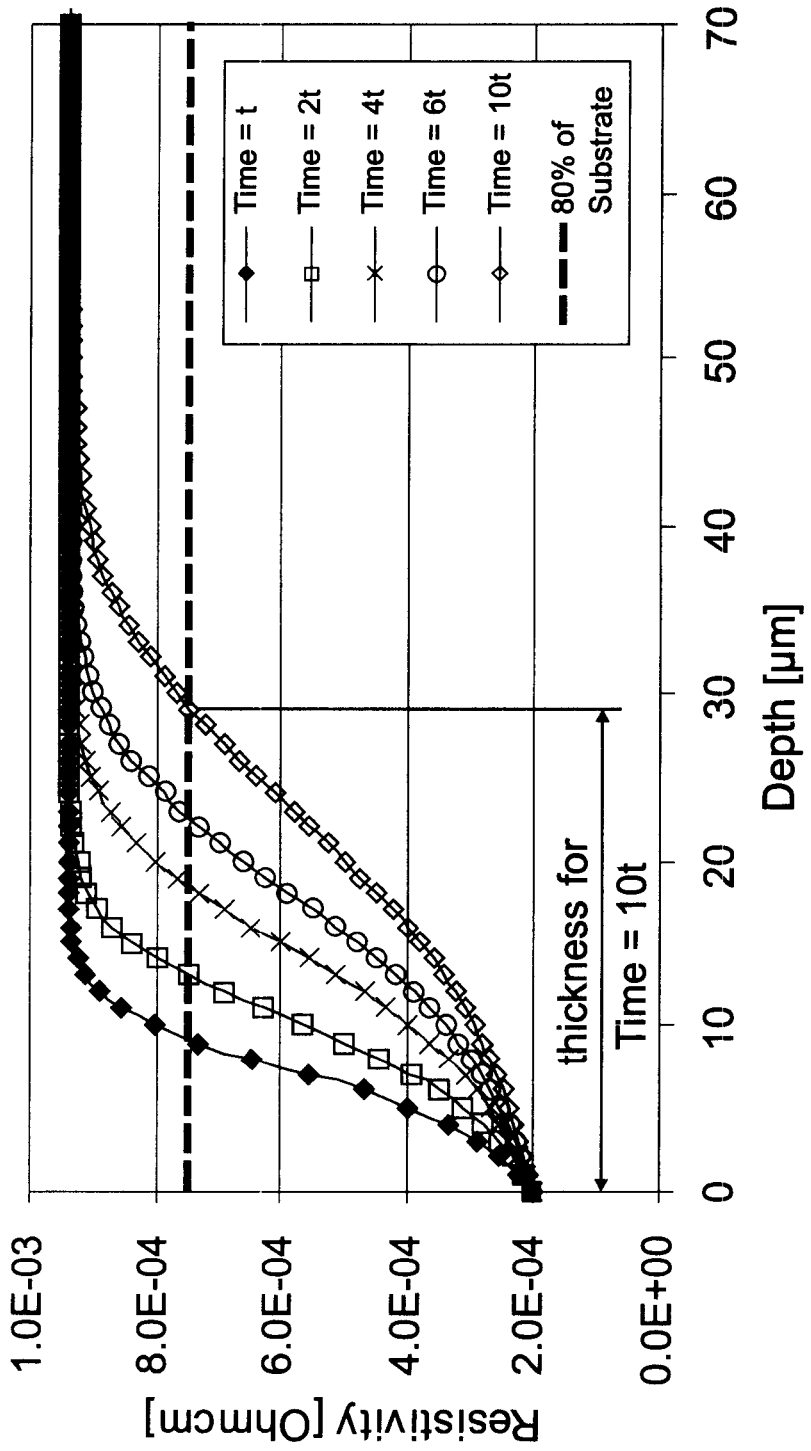
FIG. 1 illustrates the simulated resistance profile of a highly doped substrate with additional diffusion of dopant.

The invention thus relates to a semiconductor wafer comprising a substrate wafer of single crystal silicon doped with dopant atoms of the n type or p type, with a front surface and a back surface, and comprising a layer deposited epitaxially on the front surface of the substrate wafer, as well as an $n^{++}$ or $p^{++}$ doped layer with a lower resistivity than the substrate wafer, which extends below the epitaxial layer from the front surface of the substrate wafer into the substrate wafer and has a defined thickness.

The invention also relates to a process for producing a semiconductor wafer of this type, wherein dopant atoms of the n type or p type are introduced into the substrate wafer through the front surface of the substrate wafer, the dopant concentration in a layer which extends from the front surface of the substrate wafer into the substrate wafer being increased from the level $n^+$ or $p^+$ to the level $n^{++}$ or $p^{++}$, and wherein an epitaxial layer is deposited on the front surface of the substrate wafer.

Semiconductor wafers in accordance with the present invention are distinguished by a particularly low resistivity of the substrate wafer and are therefore optimally suitable as base material for the fabrication of power electronic semiconductor components. According to a particularly preferred embodiment of the process, the initial thickness of the substrate wafer is reduced by removal of material on the back surface of the substrate wafer, preferably to such an extent that the substrate wafer of reduced thickness is predominantly or exclusively $n^{++}$ or $p^{++}$ doped, which additionally reduces the resistivity of the substrate wafer. The removal of material from the back surface is usually carried out by back grinding, but can in principle also be effected using other techniques, such as lapping, polishing, CMP or etching. Since the way in which the material is removed is not pertinent to the invention, the following description mentions merely by way of example the grinding of the back surface, without thereby restricting the general nature of the invention.

After the grinding of the back surface, the substrate wafer is preferably less than 120 μm thick, particularly preferably less than 80 μm thick. The back surface of the substrate wafer can be ground before or after the process for fabricating semiconductor components, which is substantially carried out on the front surface. Components which are integrated in the epitaxially deposited layer are in particular power transistors, power MOSFETs, power ICs or IGBTs.

The dopant atoms of the n type include phosphorus, arsenic and antimony, and the dopant atoms of the p type include boron. A dopant concentration of the $n^+$ or $p^+$ level is understood by those skilled in the art to be present if it is generally no longer possible to increase the concentration of the dopant by adding more of the dopant in question to the melt during production of the single crystal without the formation of dislocations, or if production requires an extraordinarily high level of technical outlay compared to lightly doped crystals. This applies in particular if the resistivity at any position in the crystal drops below defined limit values which are dependent on the type of dopant and the crystal diameter. The limit value at which dislocations may occur in conventional production processes, for crystals with a diameter of 150 mm or 200 mm, is approximately 1 mOhmcm in the case of phosphorus, 2 mOhmcm in the case of arsenic, 10 mOhmcm in the case of antimony and 1 mOhmcm in the case of boron. When producing single crystals using the CZ process, the concentration of the dopant rises on account of segregation along the crystal axis. Therefore, economic production of highly doped single crystals with a low resistivity is only possible if the crystals are devoid of dislocations over the entire length. Problems with dislocations therefore arise even when producing crystals with higher target resistances. Consequently, a dopant concentration of the $n^+$ or $p^+$ level is present at a resistivity of approximately 1.5 mOhmcm or below in the case of phosphorus, 2.5 mOhmcm or below in the case of arsenic, 15 mOhmcm or below in the case of antimony, and 2.5 mOhmcm or below in the case of boron.

A dopant concentration of the $n^{++}$ or $p^{++}$ level is present if a dopant concentration of the $n^+$ or $p^+$ level is exceeded. This is the case in particular if the resistivity is less than 1 mOhmcm for phosphorus, less than 2 mOhmcm for arsenic, less than 10 mOhmcm for antimony and less than 1 mOhmcm for boron. The theoretical maximum dopant concentration is given by the solubility limit of the corresponding dopant and is approximately $8 \times 10^{20}/cm^3$ for boron, $1.3 \times 10^{21}/cm^3$ for phosphorus, $1.8 \times 10^{21}/cm^3$ for arsenic and $7 \times 10^{19}/cm^3$ for antimony (temperature range approx. 1000-1410° C.). Under certain conditions, higher concentrations may be present as metastable states, but under equilibrium conditions a phase separation in the form of precipitates commences.

According to the invention, the dopant concentration of the substrate wafer is increased by further dopant of the same type being forced into the substrate wafer by diffusion or implantation through the front surface of the $n^+$ or $p^+$ doped substrate wafer. According to a preferred procedure, additional dopant is forced into the substrate wafer through the whole of the front surface. However, it is also possible to mask individual regions of the front surface and in this way to incorporate additional dopant atoms in the crystal lattice in a patterned arrangement.

The result of the diffusion or implantation is a substrate wafer made from single crystal silicon, which has an $n^{++}$ or $p^{++}$ doped layer which extends from the front surface of the substrate wafer down to a certain depth into the substrate wafer. The thickness of this layer depends on the conditions, such as duration, temperature, dopant concentration and dose at which the diffusion or implantation of the additional dopant is carried out. The transition between the $n^{++}$ layer and the $n^+$ substrate, or between the $p^{++}$ layer and the $p^+$ substrate, may be relatively sharply defined or continuous, depending on the process used. Irrespective of the type of transition, the thickness of the layer is in this case defined as the thickness of the layer in which the resistivity is at least 20% lower than in the original substrate.

A thickness of at least 20 µm is preferred, and a thickness of more than 30 µm is particularly preferred. The advantageous effect of the invention is more pronounced the deeper the layer extends into the substrate wafer and the thinner the substrate wafer after the grinding of the back surface. The $n^{++}$ or $p^{++}$ doped layer is substantially devoid of dislocations.

An epitaxial layer, preferably a layer of silicon, which is doped with a lower concentration of dopant atoms than the substrate wafer, is deposited on the front surface of the substrate wafer. The doping of the epitaxial layer may be of the same type as or of the opposite type to that of the substrate. Doping of the epitaxial layer of the same type as that of the substrate is preferred. Power semiconductor components, such as power transistors, power MOSFETs, power ICs or IGBTs, are integrated in this epitaxial layer and are singulated at the end of the process to form individual components.

FIG. 1 shows the simulated profile of the resistivity in a highly doped substrate (dopant phosphorus) after additional diffusion of dopant (duration of diffusion t). The absolute thickness of the highly doped layer (in this case $n^{++}$) which has diffused in is dependent on the duration of diffusion, the temperature and the applied surface concentration of the dopant. For other dopants, the profile is in qualitative terms very similar, but the conduction type and thickness of the layer depend on the type of dopant and the respective diffusion properties in silicon.

FIG. 2 diagrammatically depicts the production process according to the invention: dopant of the same type is made to diffuse into the front surface of a highly doped silicon wafer (n type or p type). An epitaxial layer, the doping of which is significantly lower than that of the underlying substrate, is deposited on the extremely high doped layer ($n^{++}$ or $p^{++}$) formed in this way. Semiconductor components are formed on the epitaxial layer of the wafer. After processing, the back surface of the finished wafer is partially removed. This is usually done by back grinding, but can in principle also be effected by other techniques, such as lapping, polishing, CMP or etching.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing an epitaxially coated semiconductor wafer with low resistivity below the epitaxial layer, comprising
   providing a substrate wafer of single crystal silicon doped with dopant atoms of the n type or p type and having a front surface and a back surface,
   forming a layer on the front surface of the substrate wafer by introducing additional dopant atoms of the n type or p type into the substrate wafer through the whole of the front surface of the substrate wafer, the layer extending from the front surface of the substrate wafer into the substrate wafer and having a thickness of at least 20 µm, the dopant concentration in the layer being increased by the additional dopant atoms introduced from the level $n^+$ to the level $n^{++}$ when the substrate wafer is an $n^+$ doped wafer, or from the level $p^+$ to the level $p^{++}$ when the substrate wafer is a $p^+$ doped wafer;
   depositing an epitaxial layer on the front surface of the substrate wafer; and removing material from the back surface of the substrate wafer until the thickness of the substrate wafer is less than 120 µm or until the dopant level of the substrate wafer is exclusively $n^{++}$ or $p^{++}$.

2. The process of claim 1, wherein the dopants which raise the dopant level from $n^+$ to $n^{++}$ or from $p^+$ to $p^{++}$ are introduced into the substrate wafer by diffusion.

3. The process of claim 1, wherein the dopants which raise the dopant level from $n^+$ to $n^{++}$ or from $p^+$ to $p^{++}$ are introduced into the substrate wafer by implantation.

4. The process of claim 1, wherein the back surface of the substrate wafer is ground.

5. The process of claim 1, wherein the thickness of the substrate wafer is reduced following a process for fabricating electronic components.

6. The process of claim 5, wherein the back surface of the substrate wafer is ground.

7. The process of claim 1, further comprising fabricating a plurality of electronic components on the wafer, and removing from the back surface of the wafer sufficient thickness to remove substantially all of the n+ or p+ doped single crystal silicon.

8. The process of claim 1, wherein the step of forming a layer takes place on a surface of the wafer which is devoid of fabricated electronic components.

9. The process of claim 1, wherein the layer formed in the step of forming a layer is doped with phosphorus and has a resistivity of less than 1 mΩcm.

10. The process of claim 1, wherein the layer formed in the step of forming a layer is doped with arsenic and has a resistivity of less than 2 mΩcm.

11. The process of claim 1, wherein the layer formed in the step of forming a layer is doped with antimony and has a resistivity of less than 10 mΩcm.

12. The process of claim 1, wherein the layer formed in the step of forming a layer is doped with boron and has a resistivity of less than 1 mΩcm.

13. The process of claim 1 wherein the thickness of the layer formed in the step of forming a layer is at least 30 μm.

14. The process of claim 4, wherein the thickness of the wafer after the wafer is ground is less than 120 μm.

15. The process of claim 4, wherein the thickness of the wafer after the wafer is ground is less than 80 μm.

16. The process of claim 6, wherein the thickness of the wafer after the wafer is ground is less than 120 μm.

17. The process of claim 6, wherein the thickness of the wafer after the wafer is ground is less than 80 μm.

* * * * *